United States Patent
Weber et al.

(10) Patent No.: US 7,079,331 B2
(45) Date of Patent: Jul. 18, 2006

(54) DEVICE FOR HOLDING A BEAM SPLITTER ELEMENT

(75) Inventors: Ulrich Weber, Ulm (DE); Alexander Kohl, Aalen (DE); Hubert Holderer, Oberkochen (DE); Armin Schoeppach, Aalen (DE); Erwin Gaber, Heidenheim (DE); Winfried Kaiser, Aalen (DE); Reiner Garreis, Aalen (DE); Toralf Gruner, Aalen-Hofen (DE); Chris Reed, Darien, CT (US); Dragos Pariza, Bronx, NY (US); Mike Meehan, Southbury, CT (US)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/109,316

(22) Filed: Apr. 19, 2005

(65) Prior Publication Data

US 2005/0248858 A1    Nov. 10, 2005

Related U.S. Application Data

(63) Continuation of application No. PCT/EP03/11042, filed on Oct. 7, 2003.

(30) Foreign Application Priority Data

Oct. 19, 2002    (DE) ............................... 102 48 849

(51) Int. Cl.
G02B 7/02      (2006.01)
G02B 27/10     (2006.01)
G02B 27/14     (2006.01)
G02B 7/18      (2006.01)
G02F 1/01      (2006.01)

(52) U.S. Cl. .............. 359/820; 359/811; 359/831; 359/618; 359/634; 359/638; 359/615; 359/288

(58) Field of Classification Search ............... 359/811, 359/819, 820, 618, 639, 631, 634, 637, 638, 359/831, 288, 615, 737, 352; 353/101, 122
See application file for complete search history.

(56) References Cited

U.S. PATENT DOCUMENTS

| | | | |
|---|---|---|---|
| 4,453,241 A * | 6/1984 | van de Veerdonk et al. ..... 369/112.25 |
| 4,669,842 A | 6/1987 | Yomoda et al. | |
| 4,856,172 A | 8/1989 | Ahmed et al. | |
| 4,890,899 A * | 1/1990 | Aoki et al. ................ 359/615 |
| 5,066,101 A * | 11/1991 | Aoki et al. ................ 359/638 |
| 5,339,441 A * | 8/1994 | Kardos et al. ............. 359/352 |
| 6,844,993 B1 * | 1/2005 | Fujimori et al. ........... 359/820 |
| 2002/0112954 A1 | 8/2002 | Antoni et al. | |

FOREIGN PATENT DOCUMENTS

WO    WO 01/63342    8/2001

* cited by examiner

*Primary Examiner*—Loha Ben
(74) *Attorney, Agent, or Firm*—Welsh & Katz, Ltd.

(57) ABSTRACT

The invention relates to a device for holding a beam splitter element having an optically active beam splitter layer in an optical imaging device, the beam splitter element being connected to at least one support element that is fastened in the housing of the imaging device. The connection between the beam splitter element and said at least one support element is designed in such a way that the position of the beam splitter layer of the beam splitter element remains nearly constant relative to the housing independently of temperatures and of thermal stresses acting upon the beam splitter element.

29 Claims, 10 Drawing Sheets

DEVICE FOR HOLDING A BEAM SPLITTER ELEMENT

This is a continuation application of PCT/EP03/11042 with an International Filing Date of Oct. 7, 2003.

BACKGROUND OF THE INVENTION

1. Field of the Invention

The invention relates to a device for holding a beam splitter element having an optically active beam splitter layer in an optical imaging device, the beam splitter element being connected to at least one support element that is fastened in the housing of the imaging device.

2. Description of the Related Art

In projection exposure machines for microlithography having catadioptric projection objectives that have a polarizing beam splitter cube, the beam splitter cube deflects the light beam coming from the reticle into a cantilever arm with a concave mirror, while the light beam returning from the cantilever arm is let directly through the beam splitter cube. In this case, temperature changes during the ongoing operation result, in particular, from the absorption of light in the beam splitter layer of the beam splitter cube, but also from that in other layers as well as in the entire volume of the beam splitter cube. It is known that a rise in temperature results in material expansion and associated changes in the geometry of the beam splitter cube depending on the mounting of the latter. In addition, because of the fact that radiation passes through them repeatedly, specific regions of the beam splitter cube are heated more strongly than other regions.

Known designs use the beam splitter cube with the beam splitter layer vertically, i.e. in the direction of the gravity. Furthermore the volume of the beam splitter cube in such systems is much higher and the power of the laser used is much lower. Since the bearing is applied to a side face of the cube, the place for the bearing can be chosen freely and there is no area, through which radiation passes, that may not be used for the bearing. Most known systems use a beam splitter cube made of quartz comprising much lower thermal expansion than calcium fluoride ($CaF_2$), which is presently used. In the case of mounts, which hold such a beam splitter cube in the region of one or more of its side faces, undesired movements such as displacements or rotations of the beam splitter layer in the interior of the beam splitter cube, can occur. This movement, which stems, from the length expansions of the material of the beam splitter cube and, on the other hand, from deformations of the beam splitter layer owing to thermally induced stresses, worsens the imaging behavior of the catadioptric projection objective of the projection exposure machine. The thermal expansion of the beam splitter cube material can tilt and displace the plane of the beam splitter layer such that the light beam coming from the reticle is no longer reflected exactly into the cantilever arm. In addition, the beam splitter cube and the beam splitter layer can also themselves be deformed such that not only is the beam wrongly deflected, but aberrations occur in the imaging of the projection objective.

Such undesired changes of the beam splitter layer can also occur, of course, in the event of global warming in the objective.

SUMMARY OF THE INVENTION

It is therefore the object of the present invention to provide a device for holding a beam splitter element having an optically active beam splitter layer of the type mentioned at the beginning and which disposes of the disadvantages of the prior art and permits a precise and stable beam path through the beam splitter element, in particular during operation.

This object is achieved according to the invention when the connection between the beam splitter element and the at least one support element is designed in such a way that the position of the beam splitter layer of the beam splitter element remains nearly constant relative to the housing independently of temperatures and of thermal stresses acting upon the beam splitter element.

These measures ensure in a simple and advantageous way that, in the event of changed temperatures in the projection objective or in the beam splitter cube itself during operation of the projection exposure machine, for example, there is no reduction in the imaging quality of the projection objective since the beam splitter layer is constantly kept in its position as no deformations or changes in position occur. A projection light beam is thereby prevented from being wrongly deflected.

According to the invention, it can further be provided that the connection between the beam splitter element and the at least one support element is designed in such a way that it is arranged at least approximately in the region of the plane in which the beam splitter layer lies.

It is thereby possible for the beam splitter cube, upon being heated, to expand about the point of intersection of the optical axis of the reticle beam path and the cantilever arm beam path, there being no change in the position of the beam splitter layer, and the point of intersection between the optical axis of the reticle beam path and the cantilever arm beam path remaining stationary.

It is advantageous when the connection between the beam splitter element, designed as beam splitter cube, and the at least one support element is designed as a bearing, the bearing arrangement being determined statically by at least three bearings in such a way that no constraining forces act on the beam splitter cube in the event of a temperature change—in particular a global one—and of the associated volumetric change.

These measures advantageously provide between the beam splitter cube and the support element a connection that in the event of a temperature change in the beam splitter cube permits a volumetric change in conjunction with retention of the configuration, that is to say the edge length ratio of the beam splitter cube. The function of the beam splitter cube is maintained not only when the point of intersection of the optical axes of the reticle and cantilever arm beam paths remains stationary, but also in the event of a deformation of the beam splitter cube, for example owing to heating of the beam splitter layer. Moreover, the beam splitter cube is mounted in a statically determined fashion.

In another design refinement of the invention, it can be provided that the connection between the beam splitter element, designed as beam splitter cube, and the at least one support element is designed as a bearing, the bearing arrangement being overdetermined statically by a number of bearings in such a way that no constraining forces act on the beam splitter cube in the event of a temperature change and of the associated volumetric change.

A statically overdetermined bearing arrangement of the beam splitter cube is likewise advantageously possible owing to these measures. However, it is here a precondition for a constant configuration in conjunction with a volumetric change of the beam splitter cube that the beam splitter cube is exposed only to a global temperature change without other influences such as mounting tolerances etc.

Advantageous refinements and developments of the invention emerge from the further subclaims and from the exemplary embodiments described below in principle with the aid of the drawings.

BRIEF DESCRIPTION OF THE DRAWINGS

FIG. 4b shows A perspective view of a mounting part corresponding to the mounting region illustrated in FIG. 4a;

DETAILED DESCRIPTION

Figure 1:
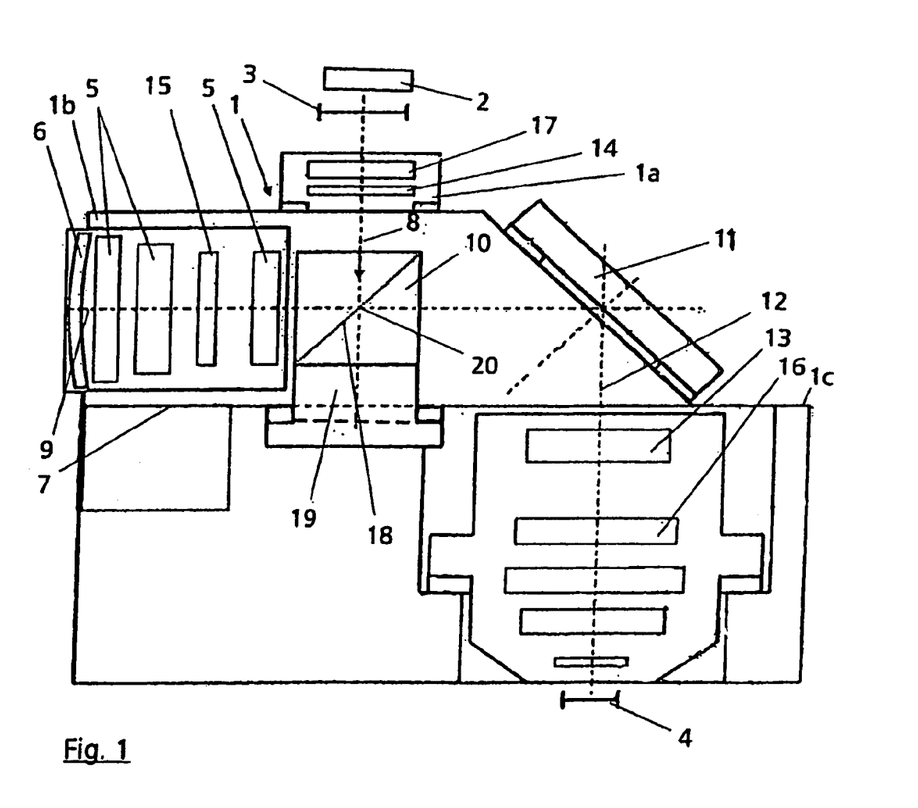
FIG. 1 shows a schematic representation with the mode of operation of a projection objective for microlithography and having a beam splitter cube.

FIG. 1 is a schematic representation of a projection exposure machine having a projection objective 1 for microlithography, for the purpose of producing semiconductor components.

It has an illumination system 2 with a laser (not illustrated) as light source. Located in the object plane of the projection exposure machine is a reticle 3 whose structure is to be imaged at an appropriately reduced scale onto a wafer 4 that is arranged below the projection objective 1 and is located in the image plane.

The projection objective 1 is provided with a first vertical objective part 1a and a second objective part 1b, which is at least approximately horizontal or inclined at up to 30° to the horizontal. Located in the objective part 1b are a number of lenses 5 and a concave mirror 6, which are arranged in an objective housing 7 of the objective part 1b. A beam splitter cube 10 is provided for deflecting the projection beam (see arrow) from the vertical objective part 1a with a vertical optical axis 8 in the objective part 1b with an at least approximately horizontal optical axis 9. The optical axis 9 can provided. The optical axis 9 can also be inclined at up to 30° to the horizontal, if appropriate.

After reflection of the beams at the concave mirror 6 and a subsequent transit through the beam splitter cube 10, these strike a deflecting mirror 11. The horizontal beam path along the optical axis 9 is deflected, in turn, at the deflecting mirror 11 onto a vertical optical axis 12. A third vertical objective part 1c with a further lens group 13 is located below the deflecting mirror 11. In addition, three λ/4 plates 14, 15 and 16 are also located in the beam path. The λ/4 plate 14 is located in the projection objective 1 between the reticle 3 and the beam splitter cube 10 downstream of a lens or lens group 17. The λ/4 plate 15 is located in the beam path of the horizontal objective part 1b, and the λ/4 plate 16 is located in the third objective part 1c. The three λ/4 plates serve the purpose of completely rotating the polarization once and thereby, inter alia, minimizes beam losses.

The light absorption in the beam splitter layer 18, in particular, but also that in other layers as well as in the entire volume of the beam splitter cube 10 leads to temperature changes in the projection objective 1 with the beam splitter cube 10, which has a beam splitter layer 18. A rise in temperature, for example, results in material expansion and associated changes of the geometry as a function of a holding device 19 of the beam splitter cube 10, which is connected to the objective housing 7.

So that the light beam is deflected from the optical axis 8 exactly onto the optical axis 9, the plane of the beam splitter layer 18 must run exactly through a point of intersection 20 of the optical axes 8, 9. In addition, the normal to the plane of the beam splitter layer 18 must be inclined to the optical axis 8 and to the optical axis 9 at half the angle which by beam splitter layer 18 at half the angle which is enclosed by the optical axes 8, 9.

A portion of the light that passes through the beam splitter cube 10 is absorbed by the latter and, as mentioned above, results in heating of the beam splitter cube 10. The beam splitter layer 18 can be tilted and displaced by the thermal expansion of the material of the cube, as a result of which the light beam, coming from the reticle, of the optical axis 8 is no longer reflected exactly onto the optical axis 9. In addition, the beam splitter cube 10 and its beam splitter layer 18 can themselves be deformed such that not only is the beam wrongly deflected, but aberrations also occur in the imaging of the projection objective 1.

Some of these negative influences can be balanced out by displacing or tilting or manipulating other optical elements of the projection objective 1 or the beam splitter cube 10 itself. In the case of such a correction of the beam splitter layer 18 in the beam splitter cube 10, the position of the beam splitter layer 18 is determined during operation and actively corrected, for example by moving special manipulators. In this case, the position can be determined by a separate measuring system for the beam splitter layer. For this purpose, one or more beams are directed in a defined fashion in an unused objective region onto the beam splitter layer, and the deflected beam or beams is/are detected. As an alternative, the position of the image itself can be ascertained by means of alignment markings and serve as basis for the correction.

However, it is more advantageous to counteract the aberration wherever it occurs, specifically at the beam splitter cube 10 or the holding device 19 thereof.

Inventive mounts, holders and bearing arrangements of the beam splitter cube 10 that minimize decentering/tilting of the beam splitter layer 18 and deformation of the beam splitter cube 10 in the event of heating of the beam splitter cube 10 are illustrated in FIGS. 2 to 16 and described below with the aid of these figures.

Figure 2:
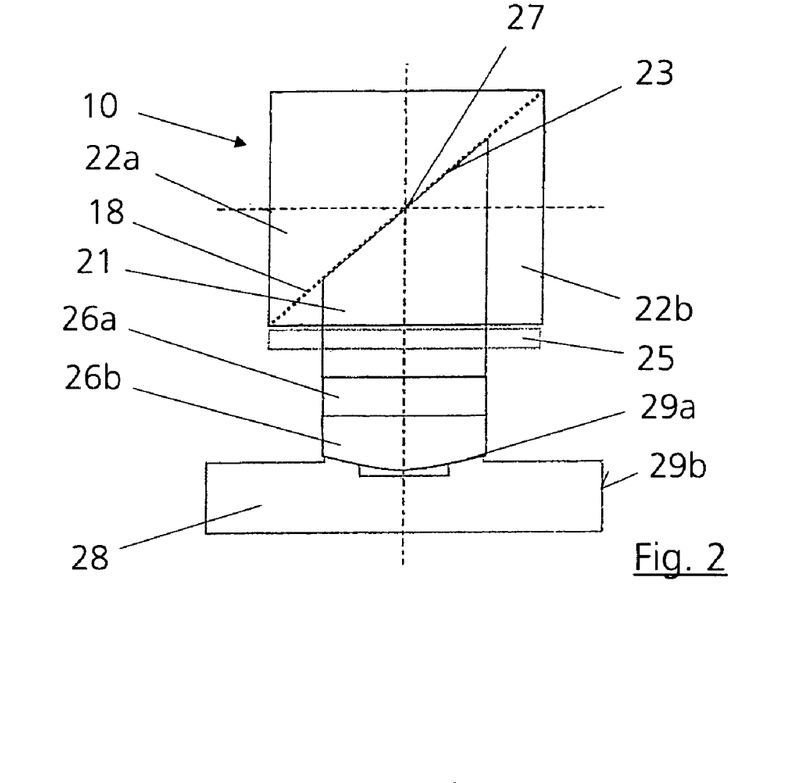
FIG. 2 shows a sectional view of the beam splitter cube mounted in a device according to the invention.
Figure 3:
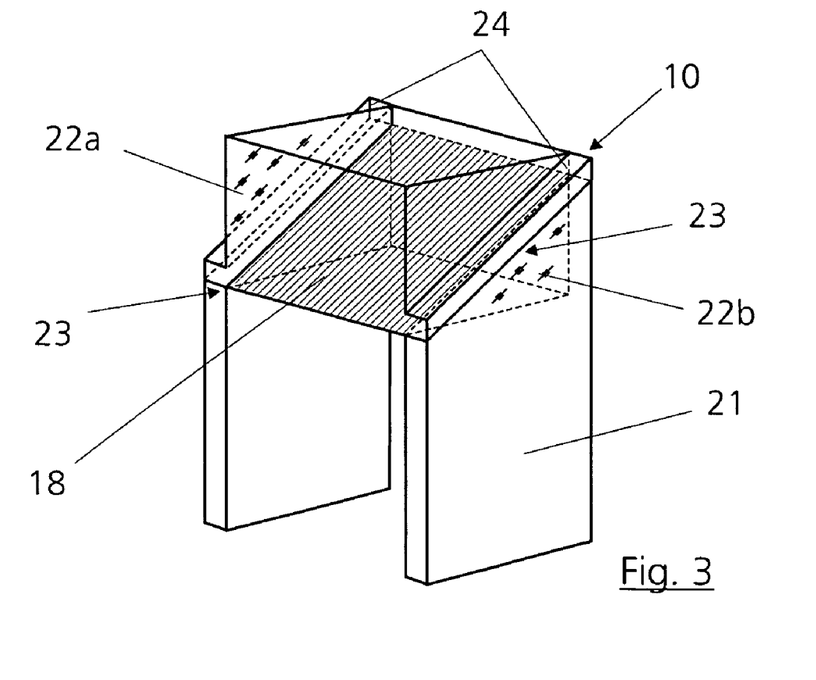
FIG. 3 shows a schematic perspective view of an inventive mount of the beam splitter cube.

As can be seen from FIG. 2, the beam splitter cube 10 is held by a holder 21 in the plane of the beam splitter layer 18. Since, as indicated in FIG. 3, the beam splitter cube 10 is assembled form two prisms 22a, 22b assembled in the region of its beam splitter layer 18, it is thereby possible to produce a supporting location 23 by virtue of the fact that the prism 22a projects laterally beyond the prism 22b, that is to say has extensions 24. In this arrangement, the prism 22a lies on the holder 21, and a prism 22b hangs from the prism 22a via wringing in the beam splitter layer 18. The beam splitter cube 10 is advantageously held on the optically unused sides by the holder 21. Of course, in another exemplary embodiment it would also be possible for the prism 22b to be held by the holder 21 and the prism 22a could be fitted to the prism 22b by wringing such that only pressure loading by the weight of the upper prism 22a takes place instead of severe tensile loading of the weight of the lower prism 22b.

In a further exemplary embodiment, it would also, of course, be possible to connect the two prisms 22a, 22b by means of elements fitted laterally thereon, and to mount these on the holder 21 at the level of the beam splitter layer 18 or of the horizontal optical axis 9 of the beam splitter cube 10.

In the present exemplary embodiment, the holder 21 consists of ZERODUR, and in another exemplary embodiment this could also be formed from another preferably thermally stable material such as, for example, quartz or INVAR or from the same material as the housing 7 of the projection objective 1. The poorest possible thermal conduction of the holder 21 is advantageous here in order to be able to dissipate the heat in a targeted fashion via a cooling device.

Figure 12:
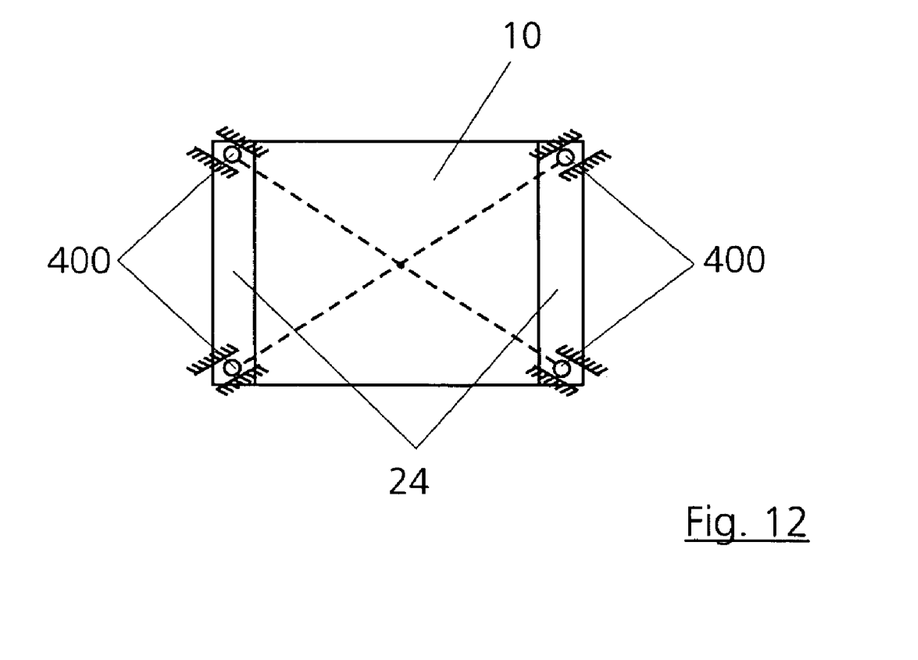
FIG. 12 shows a schematic view from below of the beam splitter cube from FIG. 3, with decoupling elements.

As indicated in FIG. 12, it is also possible to provide decoupling elements between the holder 21 and the projecting extensions 24 so as to compensate the different expansions of the prisms 22a, 22b and the holder 21. The decoupling elements 400 are designed in such a way that they secure the beam splitter cube 10 in its position without preventing an affine enlargement of the beam splitter cube 10. In a further exemplary embodiment, this function of the decoupling elements 400 could also be integrated directly in the holder 21, for example by suitable precuts in the holder 21 in the region of the supporting locations 23.

Below the beam splitter cube 10, the holder 21 offers sufficient space for a cooling plate 25 comprising a surface that absorbs the 157 nm radiation, and heat dissipating means. The cooling plate 25 is designed as a blackened metal sheet. It is provided with conducting copper strips (not illustrated in more detail) for the purpose of dissipating heat.

The holder 21 with the beam splitter cube 10 and the cooling plate 25 is held in a statically determined further holder which simultaneously permits reproducible installation and removal. An upper part 26a of the reproducible holder is permanently connected to the holder 21 or fabricated together with the latter from one part. A lower part 26b of the reproducible holder has a spherical surface at the bottom, the center 27 of the sphere being at the center of the beam splitter cube 10 such that the position of the center 27 of the beam splitter cube 10 does not vary during possible adjustment. A tilt-adjustable mount 28 supports this complete arrangement and has a contact surface 29a with the spherical surface, and a contact surface 29b with the objective housing 7 of the projection objective 1. The connection of the mount 28 with the objective housing 7 of the projection lens 1 is produced by a screwed connection. The contact surface 29a on the mount 28 has the same radius as the lower part 26b, supported thereon, for wringing after adjustment. In another exemplary embodiment, it could also have the form of a roof edge so as to produce a defined annular support for cementing the two parts to one another (not illustrated).

Figure 4A:
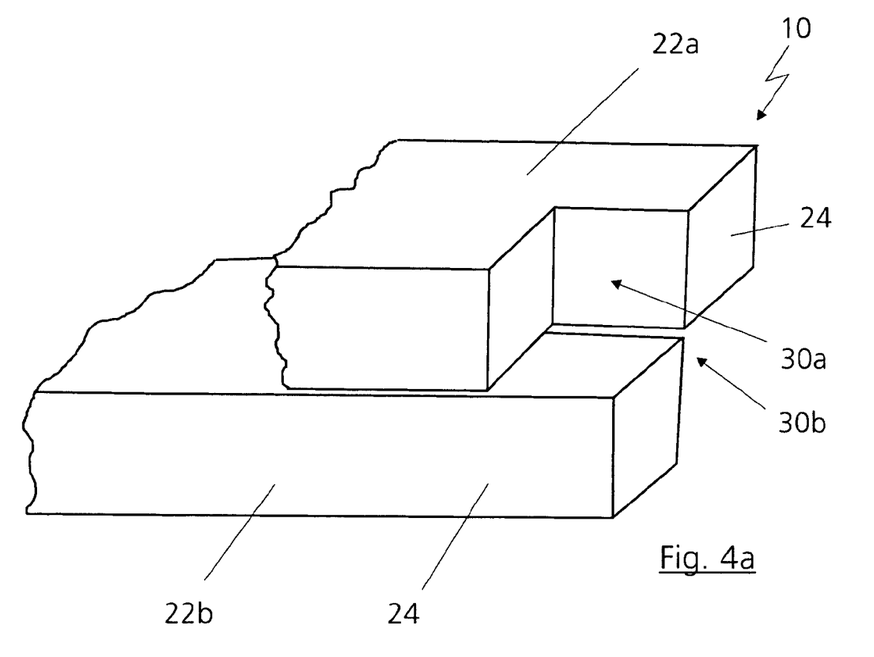
FIG. 4a shows a perspective detailed view of inventive mounting regions of the beam splitter cube.
Figure 4B:
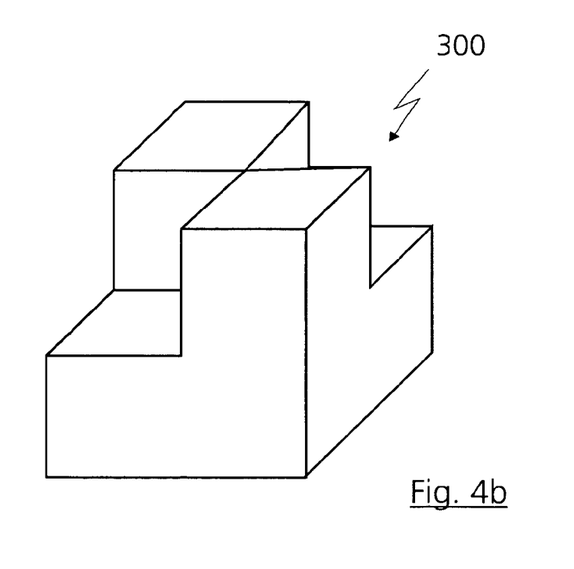

The extensions 24 fitted along the beam splitter layer 18 of the beam splitter cube 10 are illustrated schematically in FIG. 4a. The extensions 24 are fitted on the two prisms 22a and 22b in FIG. 4a. The prisms 22a, 22b are to be conceived in FIG. 4a as continuing prismatically upward and downward, respectively. It is very advantageous that the extensions 24 are arranged in different subregions of the respective prisms 22a and 22b. The result of this is the production of cutouts 30a and 30b that are diametrically opposite one another and into which a mount part 300 illustrated in FIG. 4b can be fitted.

Figure 5:
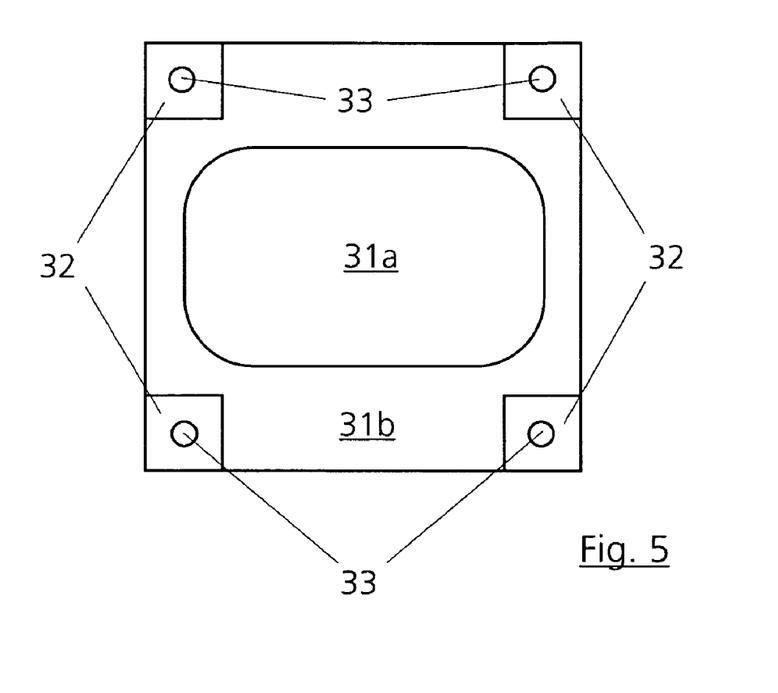
FIG. 5 shows a schematic sectional view of the beam splitter cube having an inventive mount in the optically unused regions.

As indicated in FIG. 5, the beam splitter cube 10 has an optically used oval region 31a and an optically unused region 31b. Accordingly, the beam splitter cube 10 can be provided easily and advantageously in the optically unused region 31b, for example in the corner regions there, with cutouts 32 for holding fastening elements 33 for the purpose of fastening on a mount that is not illustrated. It is rational in this case for the mounting likewise to be done on the faces of the beam splitter cube 10 averted from the light.

The inventors have found that the function of the beam splitter cube 10 is ensured when the beam splitter layer 18 is, at it were, imaged into itself again in the event of a change of shape of the beam splitter cube 10 owing to heating. In this case, the beam splitter cube 10 is permitted to experience only a volumetric change and not a change in configuration, that is to say not a change in the edge length ratios. Proposed for this purpose are suitable mounting arrangements of the beam splitter cube in a mount in accordance with FIGS. 6 to 11, which is connected to the objective housing 7 and not illustrated in more detail. The basic idea in this case is that no constraining forces that change configuration are allowed to act on the beam splitter cube 10 when the latter is heating up.

Both statically determined and statically overdetermined solutions are conceivable for bearing purposes, the statically overdetermined bearing arrangements preceding only from a purely global temperature change in the beam splitter cube 10, that is to say from a temperature change that affects all the parts. The volumetric expansion of the beam splitter cube 10 is indicated schematically in FIGS. 6 to 11 by dotted lines and bearing points.

Figure 6:
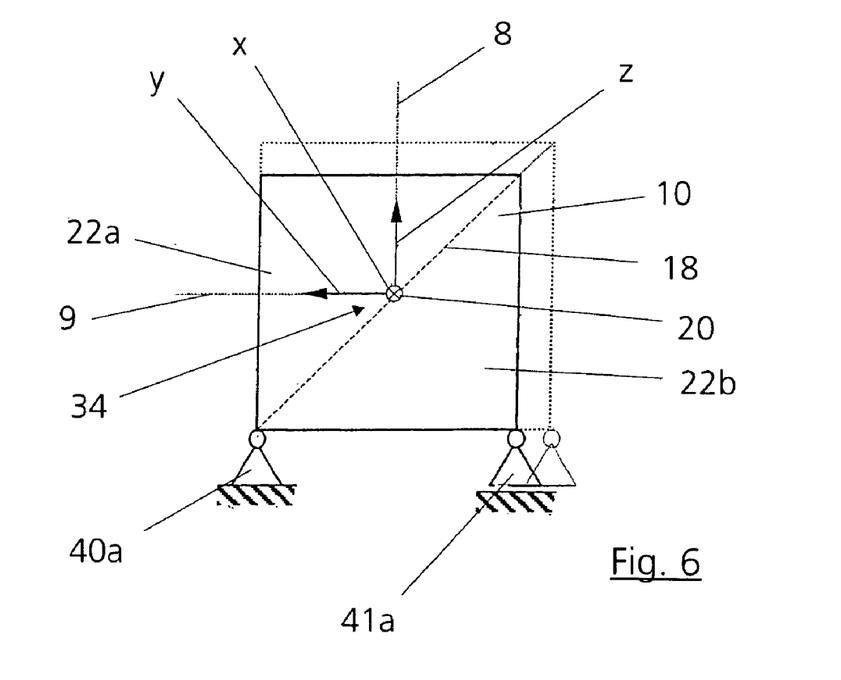
FIG. 6 shows a side view of a beam splitter cube having a first embodiment of an inventive statically determined bearing arrangement.

FIG. 6 shows schematically the bearing arrangement for a beam splitter cube 10 with a describing coordinate system 34 at the point of intersection 20 of the optical axes 8 and 9. The x-axis points into the plane of the page, the y-axis points in the direction of the optical axis 9, and the z-axis points in the direction of the optical axis 8 or in the direction of the weight force.

Figure 7:
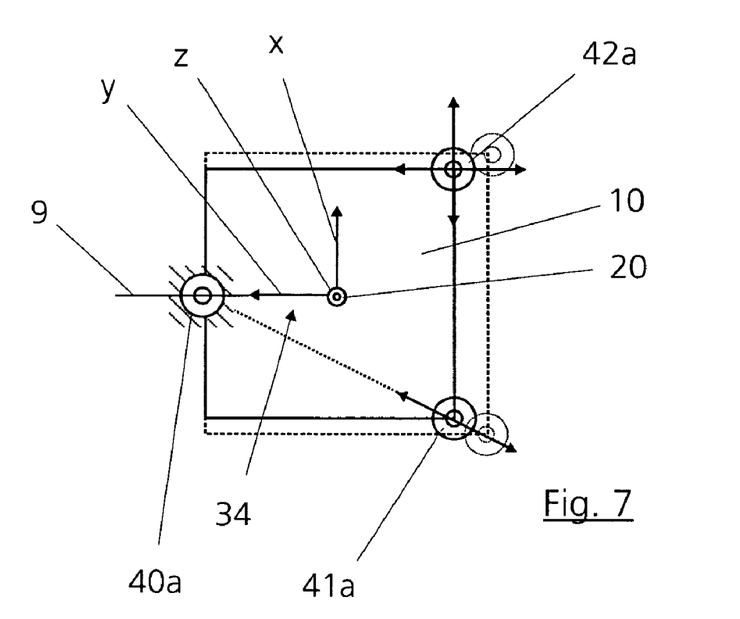
FIG. 7 shows a plan view of the beam splitter cube from FIG. 6.

As may be seen from FIG. 6, the bearing arrangement is marked on the underside of the cube by three bearings 40a, 41a, 42a (the bearing 42a is covered here by the bearing 41a and visible in FIG. 7), which can in each case support a force in the z-direction. The transmissibility of forces in the plane defined by the x- and y-axes is distributed over the bearings 40a, 41a, 42a such that given a global 41a, 42a distributed, that given a global temperature change they permit a volumetric change of the beam splitter cube 10 without causing a change in configuration and without changing the position of the beam splitter plane 18.

The beam splitter cube 10 is mounted such that the beam splitter layer 18 is imaged into itself again given a global temperature change, and in the process the point of intersection 20 of the optical axes 8 and 9 comes to lie again on the beam splitter layer 18. Since the bearing arrangement is statically determined, no constraining forces act on the beam splitter cube 10 in the event of a temperature change.

At the edge where the beam splitter layer 18 intersects the underside of the cube, the beam splitter cube 10 is secured by the bearing 40a, designed as a fixed bearing, and it is supported on the oppositely situated lower edge by the bearing 41a, designed as movable bearing, with a translational capacity, and by the bearing 42a, designed as movable bearing, the two translational capacities (the movable bearing 41a covers the movable bearing 42a in FIG. 6).

The beam splitter cube 10 shown in FIG. 6 is illustrated in FIG. 7 from above, the displacement directions of the movable bearings 41a and 42a being illustrated by arrows. In the case of the movable bearing 41a with only one translational capacity, translational capacity is directed to the bearing 40a, while the movable bearing 42a the two translational capacities can be displaced in any direction of the plane of the page.

Figure 8:
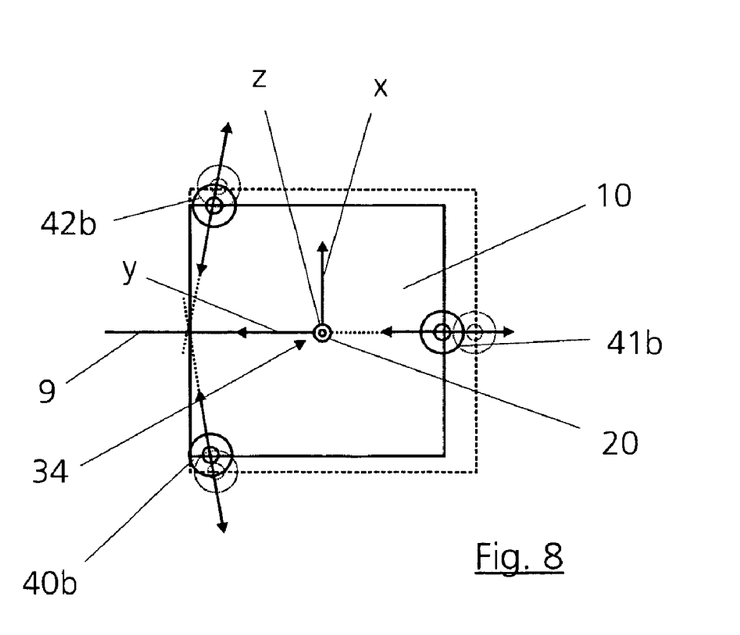
FIG. 8 shows a plan view of the beam splitter cube having a second inventive embodiment of a statically determined bearing arrangement.

As shown in FIG. 8, each bearing 40b, 41b, 42b has exactly one translational capacity in the plane defined by the x- and y-axes. Here, all translational capacities point to a point on the cut edge of the underside of the cube with the beam splitter layer 18. This ensures that the beam splitter layer ensures that the beam splitter layer 18 is imaged into itself again given a global temperature change. FIG. 8 illustrates the directions of the translational capacities of the three bearings 40b, 41b, 42b in the plane defined by the x- and y-axes.

Figure 9:
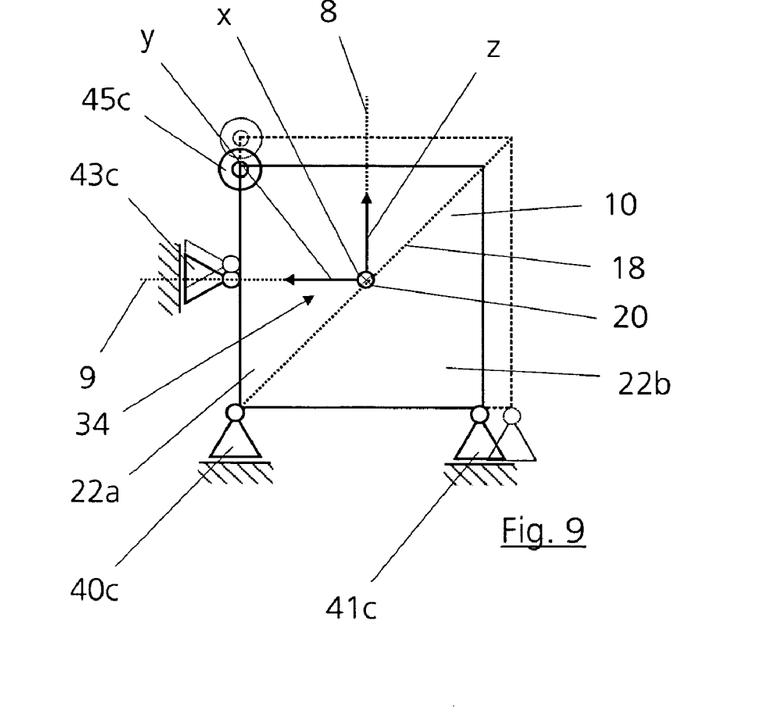
FIG. 9 shows a side view of a beam splitter cube having a third inventive embodiment of a statically determined bearing arrangement.

Further capacities exist when three bearings 40c, 41c and 42c are translationally fixed only in the z-direction, but are completely freely movable in the plane defined by the x- and y-axes.

Further bearings 43c, 44c, 45c are required in order to support the beam splitter cube 10 in a statically defined fashion in this case, each bearing being translationally fixed in one direction.

FIG. 9 shows an arrangement with the bearings 40c, 41c, 42c, 43c, 44c, 45c from the side where the beam splitter layer 18 remains in its position in the event of a temperature change. In this illustration, the bearing 42c is covered by the bearing 41c, and the bearing 44c is covered by the bearing 43c.

Of course, it is also possible to have the most varied statically determined bearing arrangements in which one or more bearings are fixed in two translational directions, while the remaining bearings are fixed only in terms of one translational direction, and in which the beam splitter layer 18 is not displaced given a temperature change.

Figure 10:
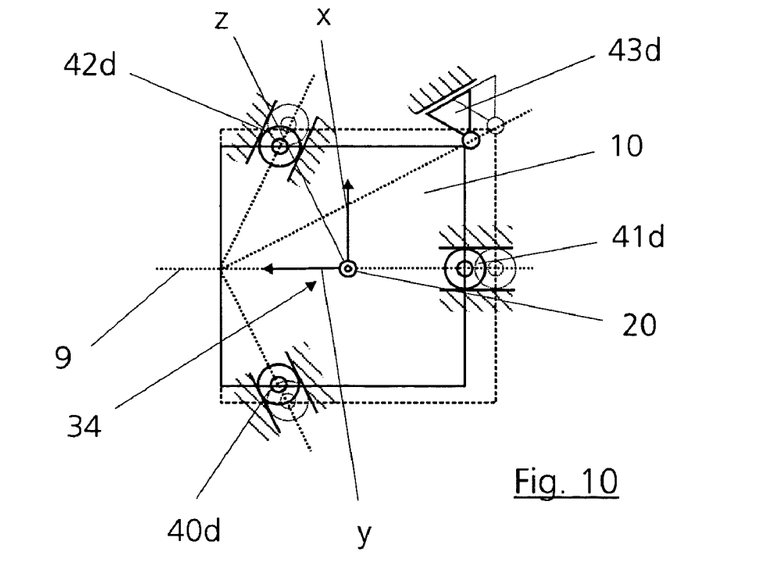
FIG. 10 shows a plan view of a beam splitter cube having a fourth inventive statically overdetermined bearing arrangement.
Figure 11:
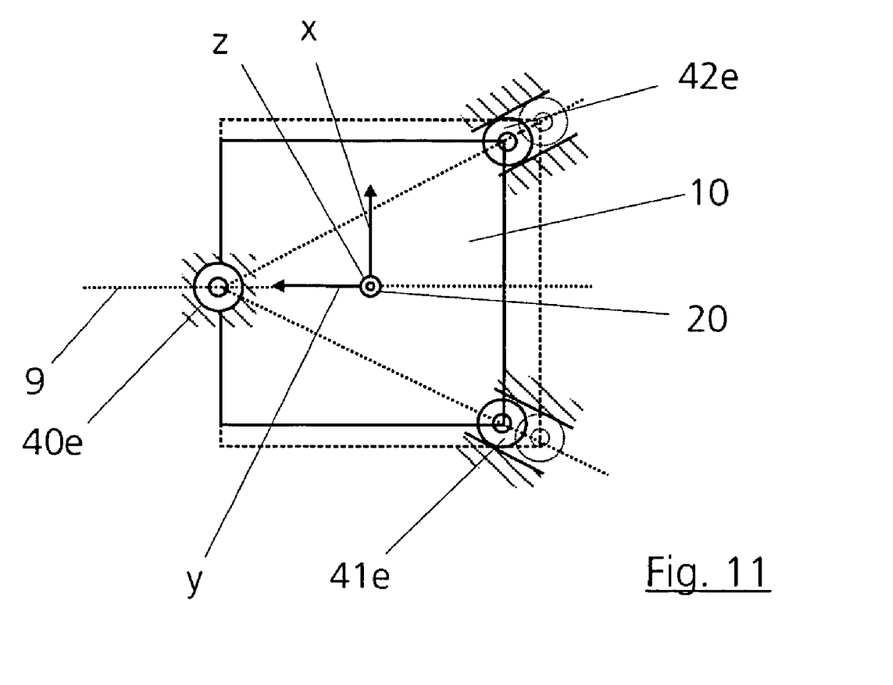
FIG. 11 shows a plan view of a beam splitter cube having a fifth inventive statically overdetermined bearing arrangement.

Considering a deformation of the beam splitter cube 10 given only a global temperature change and not owing to other influences such as assembly tolerances etc, there are also statically overdetermined bearing possibilities that permit a volumetric change of the beam splitter cube 10 without displacement of the beam splitter layer 18. In principle, the beam splitter cube 10 can then be mounted at any desired number of points, one variant consisting in that each bearing each bearing is movable in at least one translational direction, and all the free translational directions intersect a point in the plane of the beam splitter layer 18 such that the plane of the beam splitter layer 18 is not displaced given a global temperature change.

Such a bearing arrangement with four bearings 40d, 41d, 42d and 43d is illustrated from above in FIG. 10.

In a further variant, illustrated in FIG. 11, the bearing 40e is secured in all degrees of translational freedom, the other bearings 41e and 42e requiring to be movable at least in translation, and all the free translational directions requiring to intersect in the fixed bearing 40e. The fixed bearing 40e acts on the beam splitter cube 10 at the beam splitter plane 18 such that there is no change in the position of the beam splitter layer 18 given a global temperature change. As may be seen from FIG. 11, this variant with the fixed bearing 40e and the bearings 41e and 42e is illustrated from above.

Figure 13:
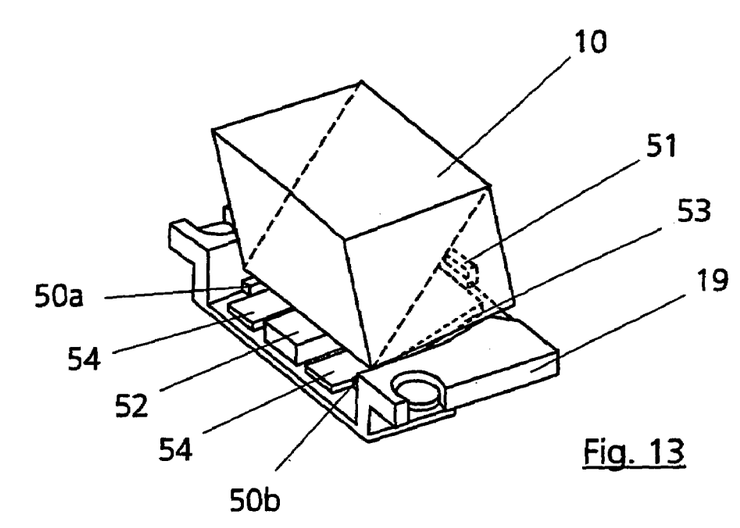
FIG. 13 shows a perspective view of a beam splitter cube in a further embodiment of an inventive mount, with flexible elements.
Figure 14:
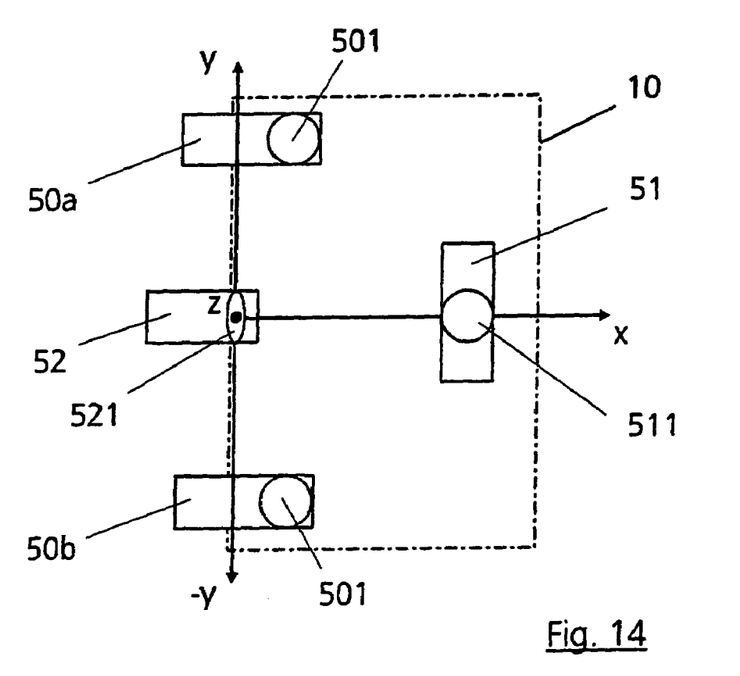
FIG. 14 shows a schematic plan view of the beam splitter cube in the mount from FIG. 13.

FIGS. 13 and 14 illustrate a further embodiment of an inventive mount of the beam splitter cube 10 on the support element 19. For this purpose, the beam splitter cube 10 is supported by two front or first flexible elements or leaf spring elements 50a, 50b, and a further rear flexible element, or leaf spring element 51. The front leaf spring elements 50a, 50b are flexible in the Y-direction and stiff in the X- and in the Z-direction. The design of the rear flexible element 51 is symmetrical about the X-axis, flexible in the X-direction, and stiff in the Y- as well as in the Z-directions. Thermal expansions of the beam splitter cube 10 are therefore permitted in the X- and Y-directions.

As may be seen, an additional flexible element or leaf spring element 52 is provided that raises the natural frequency of the arrangement. The leaf spring element 52 is arranged symmetrically in relation to the X-axis and is of stiff design in the X-direction and flexible design in the Z-direction, and prevents a rotation above the Z-axis. The additional leaf spring element 52 is advantageously arranged in the region of the beam splitter cube 10 in which the intensity of the light passing through is low. Provided in each case at the connecting points of the flexible elements 50a, 50b, 51, 52 to the beam splitter cube 10 is a coating that protects adhesive connections 501, 511, 521 of the flexible elements 50a, 50b, 51, 52 for fastening to the beam splitter cube 10 against irradiation of light (not illustrated). The connecting points of the flexible elements 50a, 50b, 51, 52 are arranged in regions of low irradiation of light.

Figure 15:
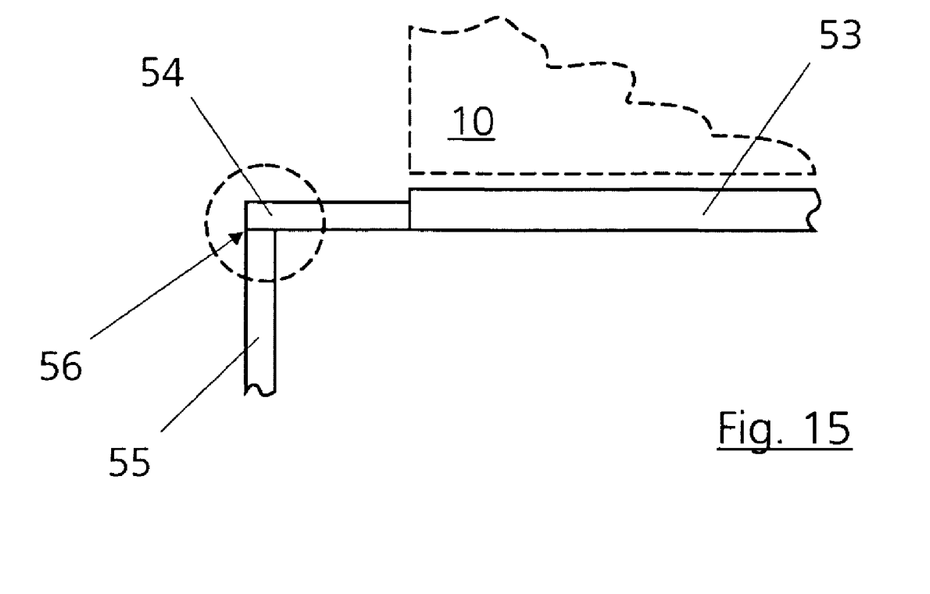
FIG. 15 shows a side view of the mount according to FIG. 13, with a beam trap.
Figure 16:
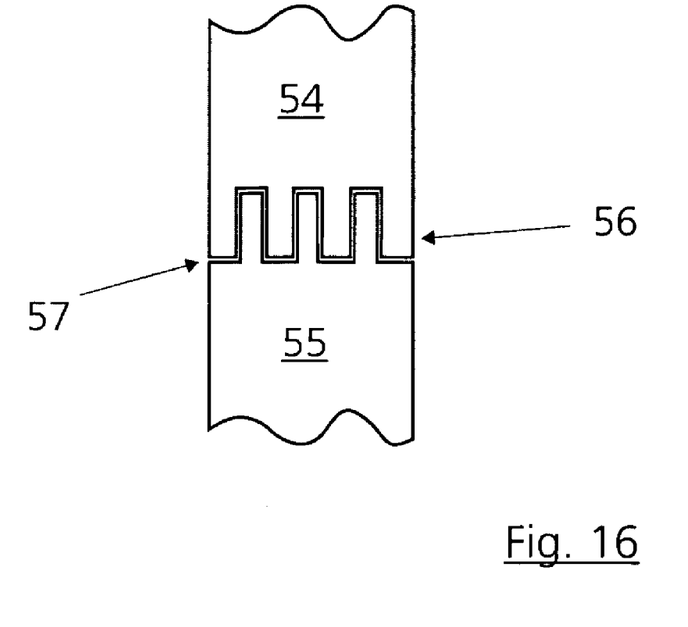
FIG. 16 shows a side view of a connection of the beam trap according to FIG. 15, for heat department.

Furthermore, as may be seen from FIG. 13, a beam or light trap 53 is arranged below the beam splitter cube 10. The light trap 53 absorbs undesired optical irradiation. In order to ensure good dissipation of heat, the light trap 53 is provided with connecting elements 54 made from copper for the purpose of dissipating heat toward the objective housing 7. However, in this case the aim is also for a dynamic decoupling from the protective housing 7 to be retained. Provided for this purpose in relation to the objective housing 7 are further connecting elements 55 that are made from ceramic and engage in a comb-like fashion toward a connecting location 56 with alternating grooves and tongues in correspondingly designed grooves and tongues of the connection elements 54, and permit good dissipation of heat over a small remaining interspace 57 in conjunction with simultaneous dynamic decoupling (indicated schematically in FIG. 16). In addition, helium can be introduced into the remaining interspace 57 and additionally creates good thermal conduction.

Moreover, in a further exemplary embodiment additional cooling elements (not illustrated) can be provided at outer surfaces of the beam splitter cube 10 in regions that are not used optically.

After assembling the arrangement, that is to say after assembling the beam splitter cube 10 in the objective 1, it is possible to compensate the deformations, caused by the weight force, of the beam splitter cube 10 by means of subsequent surface treatment, in particular by ion beam etching of the surface, at least of a further optical element of the imaging device 1.

Figure 17A:
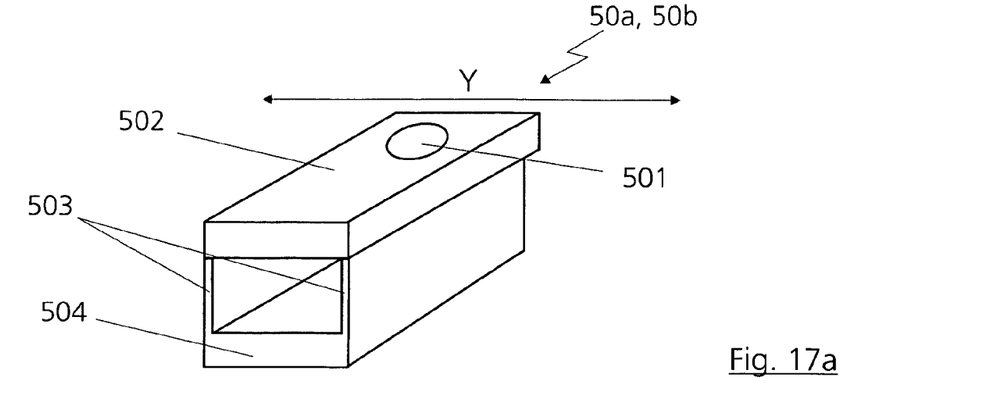
FIG. 17a shows a perspective view of a first flexible element of the mount from FIG. 14.
Figure 17B:
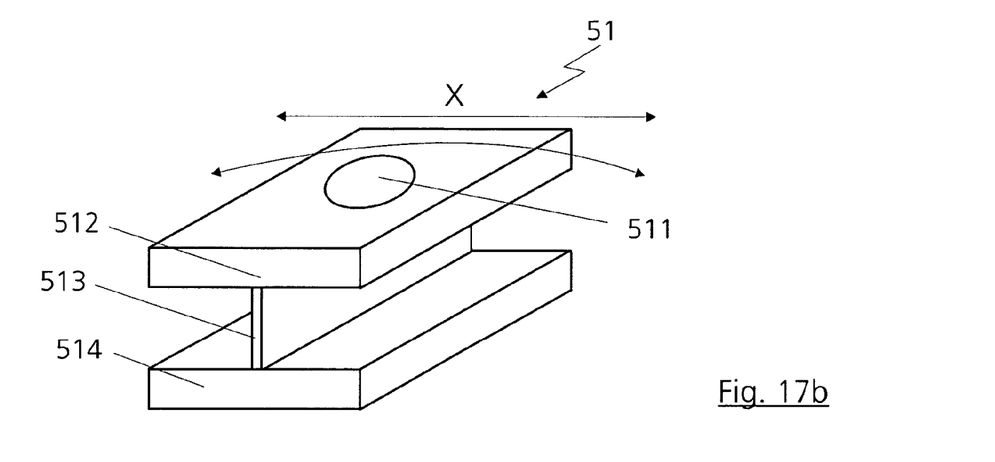
FIG. 17b shows a perspective view of a second flexible element of the mount from FIG. 14.
Figure 17C:
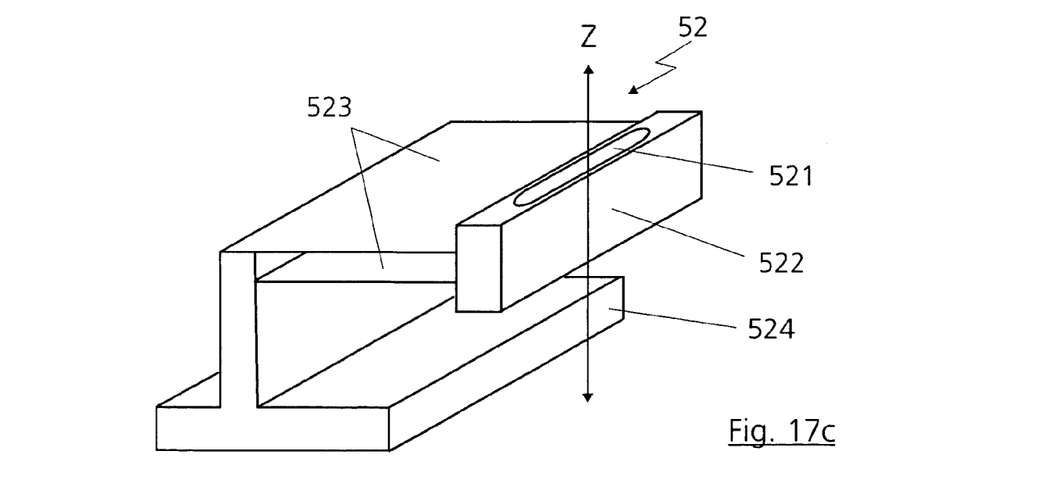
FIG. 17c shows a perspective view of a third flexible element of the mount from FIG. 14.

In FIGS. 17a–17c the flexible elements 50a, 50b, 51, 52 are shown in detail.

As may be seen from FIG. 17a, the front flexible element 50a, 50b comprises a top part 502 with the adhesive connection point 501 to the beam splitter cube 10. The top part 502 is made of a steel material comprising a thermal expansion coefficient which is approximately equal to the thermal expansion coefficient of calcium fluoride ($CaF_2$). Furthermore the front flexible element 50a, 50b comprises two leaf springs 503 which are soldered or welded to the top part 502 and which are integrated into a base part 504 made of a material comprising a thermal expansion coefficient which is as small as possible (e.g. INVAR). The front flexible element 50a, 50b is flexible in the Y-direction.

As may be seen from FIG. 17b, the rear flexible element 51 comprises a top part 512 with the adhesive connection point 511 to the beam splitter cube 10. The top part 512 is made of a steel material comprising a thermal expansion coefficient which is approximately equal to the thermal expansion coefficient of calcium fluoride ($CaF_2$). Furthermore the rear flexible element 51 comprises a leaf spring 513 which is connected to a base part 514 made of a material comprising a thermal expansion coefficient which is as small as possible (e.g. INVAR). The rear flexible element 51 is flexible in the X-direction.

As may be seen from FIG. 17c, the additional flexible element 52 is completely made of a material comprising a thermal expansion coefficient which is as small as possible (e.g. INVAR) and comprises a top part 522 with the adhesive connection point 521 to the beam splitter cube 10. Furthermore the additional flexible element 52 comprises two leaf springs 523 which are connected to a base part 524. The additional flexible element 52 is flexible in the Z-direction.

What is claimed is:

1. A device for holding a beam splitter element having an optically active beam splitter layer in an optical imaging device, the beam splitter element being connected to at least one support element that is fastened in the housing of the imaging device, wherein the connection between the beam splitter element and said at least one support element is designed in such a way that the position of the beam splitter layer of the beam splitter element remains nearly constant relative to the housing independently of temperatures and of thermal stresses acting upon the beam splitter element.

2. The device as claimed in claim 1, wherein the connection between the beam splitter element and said at least one support element is designed in such a way that it is arranged at least approximately in the region of the plane in which the beam splitter layer lies.

3. The device as claimed in claim 1, wherein the connection between the beam splitter element and said at least one support element is arranged on the optically unused sides of the beam splitter element.

4. The device as claimed in claim 1, wherein the beam splitter element is designed as a beam splitter cuboid formed from two wedge-shaped parts assembled in the region of its beam splitter layer, in particular as a beam splitter cube, at least one of said wedge-shaped parts being mounted in the region of the beam splitter layer.

5. The device as claimed in claim 4, wherein the mounts of said wedge-shaped parts are formed by extensions in respectively preferably different subregions of said wedge-shaped parts in the region of the beam splitter layer on the light-averted faces of said beam splitter cube.

6. The device as claimed in claim 4, wherein the mounts of said wedge-shaped parts are arranged at cutouts in optically unused regions of the beam splitter layer.

7. The device as claimed in claim 4, wherein the said wedge-shaped parts are assembled by wringing.

8. The device as claimed in claim 4, wherein said two wedge-shaped parts are assembled by means of connecting elements fitted laterally in each case and arranged in the region of the plane of the beam splitter layer.

9. The device as claimed in claim 1, wherein the connection between the beam splitter element, designed as beam splitter cube, and said at least one support element is designed as a bearing, the bearing arrangement being determined statically by at least three bearings in such a way that no constraining forces act on the beam splitter cube in the event of a temperature change in—particular a global one—and of the associated volumetric change.

10. The device as claimed in claim 9, wherein the bearings are arranged on the rear side, opposite the input side of the light, of the beam splitter cube.

11. The device as claimed in claim 9, wherein said bearings support the weight of the beam splitter cube in the direction of a z-axis.

12. The device as claimed in claim 9, wherein the bearing arrangement comprises fixed bearing and two movable bearings and, the first movable bearing having a translational capacity whose direction is defined by the connection between the movable bearing and the fixed bearing, and it being possible for the second movable bearing to be displaced by translation at will in the direction of the x- and y-axes, which are perpendicular to the z-axis.

13. The device as claimed in claim 9, wherein the bearing arrangement comprises three movable bearings, each movable bearing having a translational capacity in the plane perpendicular to the z-axis and defined by the x- and y-axes, the respective translational capacities of said movable bearings pointing to a point on the cut edge between the beam splitter layer and the rear side of the beam splitter cube.

14. The device as claimed in claim 9, wherein the bearing arrangement comprises six movable bearings, three of said six movable bearings being freely movable in the plane at right angles to the z-axis and defined by the x- and y-axes, and determines the three other movable bearings each being translationally fixed in a direction x, y, z.

15. The device as claimed in claim 1, wherein the connection between the beam splitter elements designed as beam splitter cubes and said at least one support element is designed as a bearing, the bearing arrangement being statically determined by a number of bearings in such a way that no constraining forces act on the beam splitter cube in the event of a global temperature change and associated volumetric change.

16. The device as claimed in claim 15, wherein the bearing arrangement comprises a number of movable bearings, each said movable bearing being movable at least in one translation direction, and all the free translation directions of said movable bearings intersecting at a point in the plane of the beam splitter layer.

17. The device as claimed in claim 15, wherein the bearing arrangement comprises a fixed bearing and a number of movable bearings, each of said movable bearing being movable at least in one translation direction, and all the free translation directions of said movable bearings intersecting in the point defined by the fixed bearing.

18. The device as claimed in claim 17, wherein said fixed bearing is arranged on the cut edge between the beam splitter layer and the rear side of the beam splitter cube.

19. The device as claimed in claim 1, wherein the connection between the beam splitter elements designed as beam splitter cube, and said at least one support element is formed by at least two first flexible elements, which are stiffly designed in the Z- and in the X-directions and flexibly designed in the Y-direction, and a further flexible element, which is stiff in the Z- and Y-directions and flexible in the X-direction.

20. The device as claimed in claim 19, wherein the connection has at least one additional flexible element for raising the natural frequency of the beam splitter cube.

21. The device as claimed in claim 19 or 20, wherein said flexible elements are designed as leaf spring elements.

22. The device as claimed in claim 21, wherein said additional leaf spring element is arranged in a region on the beam splitter cube for which the intensity of the traversing light is low.

23. The device as claimed in claim 21, wherein a coating is provided at the points connecting the first leaf spring elements and/or the further leaf spring element and/or the additional leaf spring element to the beam splitter cube, this being done in such a way that bonded connections for fastening the beam splitter cube with the leaf spring elements are protected against the irradiation of light in the lower region of the beam splitter cube.

24. The device as claimed in claim 21, wherein a coating is provided at the points connecting the further leaf spring element to the beam splitter cube, this being done in such a way that a bonded connection for fastening the beam splitter cube with the leaf spring element is protected against the irradiation of light in the lower region of the beam splitter cube.

25. The device as claimed in claim 21, wherein a coating is provided at the points connecting the additional leaf spring element to the beam splitter cube, this being done in such a way that a bonded connection for fastening the beam splitter cube with the leaf spring element is protected against the irradiation of light in the lower region of the beam splitter cube.

26. The device as claimed in claim 19, wherein a beam trap is provided between said support element and the beam splitter cube.

27. The device as claimed in claim 26, wherein said beam trap is connected to the housing of the imaging device, via connecting elements coupled to further connecting elements, in such a way that a dissipation of heat is ensured in conjunction with dynamic decoupling from the housing of the imaging device.

28. The device as claimed in claim 27, wherein said connecting elements and said further connecting elements are each provided on the end facing said other connecting element with alternating grooves and tongues, this being done in such a way that they interlock without contact in comb-like fashion, at their connection site, an interspace of small dimension remaining between them.

29. A projection exposure machine for microlithography for producing semiconductor elements, comprising a projection objective in which a beam splitter element is arranged in a holding device as claimed in claim 1.

\* \* \* \* \*

UNITED STATES PATENT AND TRADEMARK OFFICE
CERTIFICATE OF CORRECTION

PATENT NO. : 7,079,331 B2  
APPLICATION NO. : 11/109316  
DATED : July 18, 2006  
INVENTOR(S) : Weber et al.

Page 1 of 1

It is certified that error appears in the above-identified patent and that said Letters Patent is hereby corrected as shown below:

Column 10, line 61-62  
Please delete "...elements designed as beam splitter cubes"  
and insert --...element, designed as beam splitter cube,...-- therefor Column 11, line 17  
Please delete "...elements designed..." and insert --...element, designed...-- therefor Signed and Sealed this Nineteenth Day of June, 2007

JON W. DUDAS  
*Director of the United States Patent and Trademark Office*